United States Patent
Qin

(10) Patent No.: US 10,312,461 B2
(45) Date of Patent: Jun. 4, 2019

(54) FLEXIBLE OLED DISPLAY PANEL HAVING A SUBSTRATE WITH A TITANIUM LAYER AND METHOD FOR MANUFACTURING SAME

(71) Applicant: WUHAN CHINA STAR OPTOELECTRONICS SEMICONDUCTOR DISPLAY TECHNOLOGY CO., LTD., Wuhan, Hubei (CN)

(72) Inventor: Fang Qin, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/735,609

(22) PCT Filed: Nov. 22, 2017

(86) PCT No.: PCT/CN2017/112395
§ 371 (c)(1),
(2) Date: Dec. 12, 2017

(65) Prior Publication Data
US 2019/0131550 A1    May 2, 2019

(51) Int. Cl.
*H01L 51/00* (2006.01)
*H01L 27/32* (2006.01)
*H01L 51/56* (2006.01)

(52) U.S. Cl.
CPC ...... *H01L 51/0097* (2013.01); *H01L 27/3262* (2013.01); *H01L 27/3272* (2013.01); *H01L 51/003* (2013.01); *H01L 51/56* (2013.01); *H01L 2227/326* (2013.01); *H01L 2251/5338* (2013.01)

(58) Field of Classification Search
CPC ............. H01L 51/0097; H01L 27/3262; H01L 27/3272; H01L 51/003; H01L 51/56; H01L 2227/326; H01L 2251/5338
See application file for complete search history.

(56) References Cited

U.S. PATENT DOCUMENTS

| | | | |
|---|---|---|---|
| 2009/0298211 A1 | 12/2009 | Kim | |
| 2013/0320317 A1* | 12/2013 | Lee | H01L 29/78606 257/40 |
| 2015/0188084 A1 | 7/2015 | Kang et al. | |
| 2017/0222192 A1 | 8/2017 | You et al. | |
| 2017/0271625 A1 | 9/2017 | Liu et al. | |
| 2017/0293171 A1* | 10/2017 | Yamazaki | G02F 1/133603 |

FOREIGN PATENT DOCUMENTS

CN    105637638 A    6/2016

* cited by examiner

*Primary Examiner* — Peter Bradford
(74) *Attorney, Agent, or Firm* — Soroker Agmon Nordman

(57) ABSTRACT

The present disclosure provides a flexible organic light-emitting diode (OLED) display panel including a flexible substrate and a plurality of thin film transistor (TFT) devices disposed on the flexible substrate. The flexible substrate comprises: a first polyimide (PI) layer; a first inorganic barrier layer disposed on a surface of the first PI layer; a titanium metal layer disposed on a surface of the first inorganic barrier layer; a second PI layer disposed on a surface of the titanium metal layer; and a second inorganic barrier layer disposed on a surface of the second PI layer. The TFT devices are disposed on a surface of the second inorganic barrier layer.

11 Claims, 1 Drawing Sheet

FLEXIBLE OLED DISPLAY PANEL HAVING A SUBSTRATE WITH A TITANIUM LAYER AND METHOD FOR MANUFACTURING SAME

FIELD OF DISCLOSURE

The present disclosure relates to the field of display technology, and more particularly to a flexible organic light-emitting diode (OLED) display panel and a method for manufacturing same.

BACKGROUND

Because of their many outstanding properties, including self-illumination, short response time, and wide viewing angles, organic light-emitting diode (OLED) displays are widely used in a lot of applications. Nowadays, flexible displays have become a mainstream, next generation display technology.

Currently, in order to realize flexibility and pliability of display apparatus, thin film transistors (TFTs) and display devices are formed on a polyimide (PI) substrate, rather than being formed on a fragile and non-flexible glass substrate. However, owing to its flexible and pliable property, PI cannot serve as a support base plate. Instead, PI is first coated on a glass base plate, and the PI substrate is separated from the glass base plate thereafter using a laser after display devices are finally formed on the substrate, to complete manufacturing of flexible displays. However, in using the laser to remove the glass base plate, a high energy laser would damage electrical properties of TFT devices and consequently decrease product yield. Thus, a bilayer PI structure has been developed, which uses an inorganic barrier layer disposed between the two PI layers to reduce energy of the laser transmitted toward TFT devices. Such a design requires a thick inorganic barrier layer. This adversely reduces the flexibility of the substrate.

Therefore, the inorganic barrier layer of flexible substrates in conventional flexible OLED display panels is thick, which influences the flexibility of flexible OLED display panels, making it difficult for flexible OLED display panels to achieve the desired flexibility.

SUMMARY OF DISCLOSURE

The present disclosure provides a flexible OLED display panel which ensures that TFT devices will not be damaged during the manufacturing process of the panel and that the flexibility of the OLED display panel will not be reduced. The present disclosure solves the problems existing in conventional flexible OLED display panels, where the inorganic barrier layer of flexible substrates has a thickness that would reduce the flexibility of flexible OLED display panels.

To solve the aforementioned problems, the present disclosure provides the following technical schemes.

In a first aspect, the present disclosure provides a flexible organic light-emitting diode (OLED) display panel including a flexible substrate and a plurality of thin film transistor (TFT) devices disposed on the flexible substrate, the flexible substrate comprising:

a first polyimide (PI) layer;

a first inorganic barrier layer disposed on a surface of the first PI layer;

a titanium metal layer disposed on a surface of the first inorganic barrier layer, wherein the titanium metal layer is patterned to form a pattern of the titanium metal layer;

a second PI layer disposed on a surface of the titanium metal layer; and a second inorganic barrier layer disposed on a surface of the second PI layer;

wherein the TFT devices are disposed on a surface of the second inorganic barrier layer;

wherein the TFT devices include at least an active layer, a projection of the pattern of the titanium metal layer on the second inorganic barrier layer corresponds to a pattern of the active layer, and the pattern of the titanium metal layer is positioned opposite to the active layer.

In accordance with one preferred embodiment of the present disclosure, the first inorganic barrier layer and the second inorganic barrier layer are made of $TiO_2$.

In accordance with one preferred embodiment of the present disclosure, a thickness of the first PI layer and a thickness of the second PI layer are same, a thickness of the first inorganic barrier layer and a thickness of the second inorganic barrier layer are same, and the thickness of the first inorganic barrier layer and the thickness of the second inorganic barrier layer are one third of the thickness of the first PI layer and the thickness of the second PI layer.

In accordance with one preferred embodiment of the present disclosure, a thickness of the titanium metal layer, the thickness of the first inorganic barrier layer, and the thickness of the second inorganic barrier layer are same.

In a second aspect, the present disclosure provides a flexible organic light-emitting diode (OLED) display panel including a flexible substrate and a plurality of thin film transistor (TFT) devices disposed on the flexible substrate, the flexible substrate comprising:

a first polyimide (PI) layer;

a first inorganic barrier layer disposed on a surface of the first PI layer;

a titanium metal layer disposed on a surface of the first inorganic barrier layer;

a second PI layer disposed on a surface of the titanium metal layer; and a second inorganic barrier layer disposed on a surface of the second PI layer;

wherein the TFT devices are disposed on a surface of the second inorganic barrier layer.

In accordance with one preferred embodiment of the present disclosure, the first inorganic barrier layer and the second inorganic barrier layer are made of $TiO_2$.

In accordance with one preferred embodiment of the present disclosure, a thickness of the first PI layer and a thickness of the second PI layer are same, a thickness of the first inorganic barrier layer and a thickness of the second inorganic barrier layer are same, and the thickness of the first inorganic barrier layer and the thickness of the second inorganic barrier layer are one third of the thickness of the first PI layer and the thickness of the second PI layer.

In accordance with one preferred embodiment of the present disclosure, a thickness of the titanium metal layer, the thickness of the first inorganic barrier layer, and the thickness of the second inorganic barrier layer are same.

In a third aspect, the present disclosure provides a method for manufacturing a flexible organic light-emitting diode (OLED) display panel, comprising:

a step S10 of providing a glass base plate;

a step S20 of forming a first polyimide (PI) layer on the glass base plate;

a step S30 of forming a first inorganic barrier layer on the a surface of the first PI layer;

a step S40 of forming a titanium metal layer on a surface of the first inorganic barrier layer;

a step S50 of forming a second PI layer on a surface of the titanium metal layer;

a step S60 of forming a second inorganic barrier layer on a surface on the second PI layer; and a step S70 of forming a plurality of thin film transistor (TFT) devices on a surface of the second inorganic barrier layer.

In accordance with one preferred embodiment of the present disclosure, the step S40 further comprises:

a step S401 of patterning the titanium metal layer to form a pattern of the titanium metal layer.

In accordance with one preferred embodiment of the present disclosure, the step S70 comprises:

a step S701 of correspondingly forming the TFT devices directly above and opposite to the pattern of the titanium metal layer.

In accordance with one preferred embodiment of the present disclosure, the method further comprises:

a step S80 of using a laser to separate the first PI layer from the glass base plate.

Compared to conventional flexible OLED display panels, the flexible OLED display panel of the present disclosure adds a titanium metal layer in the flexible substrate in order to effectively absorb the energy of the laser. Such a configuration could reduce the thickness of the inorganic barrier layer and further increase the flexibility of the flexible OLED display panels. The present disclosure solves the problems existing in conventional organic flexible OLED display panels, where the inorganic barrier layer of flexible substrates is thick, which influences the flexibility of flexible OLED display panels, making it difficult for flexible OLED display panels to achieve the desired flexibility.

BRIEF DESCRIPTION OF DRAWINGS

To explain in detail the technical schemes of the embodiments or existing techniques, drawings that are used to illustrate the embodiments or existing techniques are provided. The illustrated embodiments are just a part of those of the present disclosure. It is easy for any person having ordinary skill in the art to obtain other drawings without labor for inventiveness.

DETAILED DESCRIPTION

Figure 1:
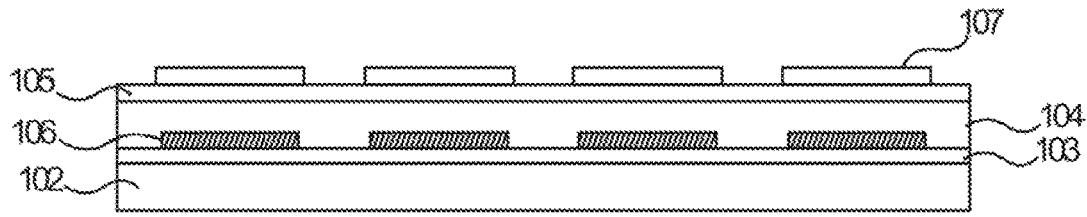
FIG. 1 is a schematic diagram showing a cross-sectional structure of a flexible OLED display panel of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

The present disclosure solves the problems existing in conventional flexible OLED display panels, where the inorganic barrier layer of flexible substrates is thick, which influences the flexibility of flexible OLED display panels, making it difficult for flexible OLED display panels to achieve the desired flexibility.

As shown in FIG. 1, the present disclosure provides a flexible organic light-emitting diode (OLED) display panel including a flexible substrate and a plurality of thin film transistor (TFT) devices The flexible substrate comprises: a first polyimide (PI) layer 102; a first inorganic barrier layer 103 disposed on a surface of the first PI layer 102; a titanium metal layer disposed on a surface of the first inorganic barrier layer 103; a second PI layer 104 disposed on a surface of the titanium metal layer; and a second inorganic barrier layer 105 disposed on a surface of the second PI layer 104. The TFT devices are disposed on a surface of the second inorganic barrier layer 105.

Titanium has excellent flexibility, low thermal conductivity, and outstanding light absorbing ability. Therefore, the titanium metal layer made from titanium can absorb most of the energy of the laser used to separate the first PI substrate from the glass base plate, and thus prevent laser from passing through the second PI layer adjacent to the TFT devices, thereby achieving the effect of protecting electrical properties of the TFT devices. The titanium metal layer has a certain electrical conductivity to reduce conductive particles generated during the process to be adhered to the first PI layer 102 and the second PI layer 104, such that cleanness of the first PI layer 102 and the second PI layer 104 is improved, raising the yield of products.

Within the flexible substrate, the first PI layer 102 and the second PI layer 104 have much more flexibility. Thus, the first PI layer 102 is used as a first substrate of the flexible substrate, and meanwhile functions as a first protective layer of the flexible substrate. The second PI layer 104 is used as a second substrate of the flexible substrate, and meanwhile functions as a second protective layer of the flexible substrate. The first inorganic barrier layer 103 is used as a first water blocking layer of the flexible substrate to avoid water entering the titanium metal layer. The second inorganic barrier layer 105 is used as a second water blocking layer of the flexible substrate to further avoid water entering the flexible substrate and to protect light-emitting devices formed on the surface of the flexible substrate.

By a masking process, the titanium metal layer is patterned to from a pattern of the titanium metal layer 106. The TFT devices include at least an active layer 107. A projection of the pattern of the titanium metal layer 106 on the second inorganic barrier layer 105 corresponds to a pattern of the active layer 107, and the pattern of the titanium metal layer 106 is positioned opposite to the active layer 107. That is, a projection of the pattern of the titanium metal layer 106 on the second inorganic barrier layer 105 corresponds to a pattern of the active layer 107. In this way, the pattern of the active layer 107 can be shielded by the pattern of the titanium metal layer 106.

The pattern of the titanium metal layer 106 is distributed in a form of an array. There is an interval between any two adjacent patterns of the titanium metal layer 106. The interval can absorb stress generated by bending the flexible substrate, so that the flexible substrate has excellent flexibility.

For example, there exists a titanium metal in an interval between two adjacent patterns of the titanium metal layer 106. A thickness of the titanium metal in the interval is half of a thickness of the pattern of the titanium metal layer 106. In other words, when the titanium metal layer is etched, the etched depth of the titanium metal layer is half of thickness of the titanium metal layer. Such a configuration can prevent the laser from passing through the interval between two adjacent patterns of the titanium metal layer 106 and from reaching the layer where TFT devices are located, wherein such a laser could possibly damage metal wires disposed on the layer where TFT devices are located.

The first inorganic barrier layer 103 and the second inorganic barrier layer 105 can be made of $Al_2O_3$, $TiO_2$, SiNx, SiCNx, or SiOx. Preferably, the first inorganic barrier layer 103 and the second inorganic barrier layer 105 are made of $TiO_2$, in order to increase the flexibility of the flexible substrate.

A thickness of the first PI layer 102 and a thickness of the second PI layer 104 are same, a thickness of the first inorganic barrier layer 103 and a thickness of the second inorganic barrier layer 105 are same, and the thickness of the first inorganic barrier layer 103 and the thickness of the second inorganic barrier layer 105 are one third of the thickness of the first PI layer 102 and the thickness of the second PI layer 104. Use of titanium metal layer makes the conventional inorganic barrier layer, which is thick, have a reduced thickness, and therefore further increases the flexibility of the flexible substrate.

A thickness of the titanium metal layer, the thickness of the first inorganic barrier layer 103, and the thickness of the second inorganic barrier layer 105 are same.

The flexible OLED display panel further includes: a plurality of OLED display devices disposed correspondingly on a surface of the TFT devices, a flexible encapsulation cover disposed on the flexible substrate and covering the OLED display devices.

Figure 2:
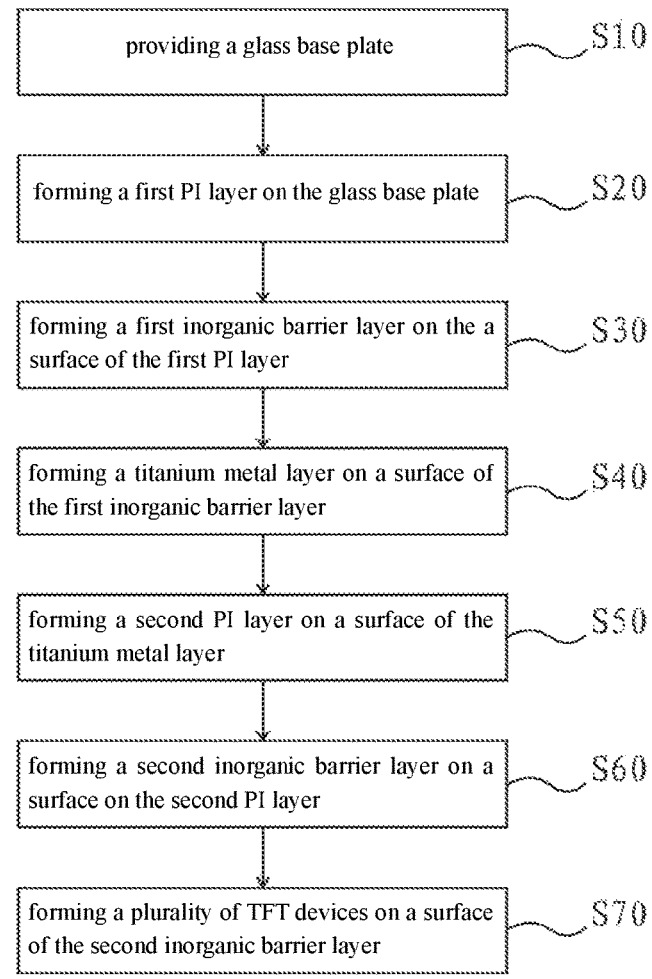
FIG. 2 is a flowchart showing a method for manufacturing a flexible OLED display panel of the present disclosure.

Please refer to FIG. 2. In accordance with the above objective of the present disclosure, the present disclosure provides a method for manufacturing a flexible organic light-emitting diode (OLED) display panel, comprising the following steps.

In a step S10, a glass base plate is provided.

In a step S20, a first polyimide (PI) layer is formed on the glass base plate. Specifically, after a liquid PI layer is coated on a surface of the glass base plate, the liquid PI layer is cured to form the first PI layer.

In a step S30, a first inorganic barrier layer is formed on a surface of the first PI layer.

In a step S40, a titanium metal layer is formed on a surface of the first inorganic barrier layer.

The step S40 further comprises a step S401 of patterning the titanium metal layer to form a pattern of the titanium metal layer.

In a step S50, a second PI layer is formed on a surface of the titanium metal layer. Specifically, after a liquid PI layer is coated on a surface of the titanium metal layer, the liquid PI layer is cured to form the second PI layer.

In a step S60, a second inorganic barrier layer is formed on a surface on the second PI layer.

In a step S70, a plurality of thin film transistor (TFT) devices are formed on a surface of the second inorganic barrier layer. Specifically, an amorphous silicon layer is deposited on a surface of the second PI layer first. Next, a laser annealing process is used to transform the amorphous silicon layer to a polysilicon layer. Then, with the use of an etching process, the polysilicon layer is patterned to form an active layer of the TFT devices.

The step S70 comprises a step S701 of correspondingly forming the TFT devices directly above and opposite to the pattern of the titanium metal layer.

Compared to conventional flexible OLED display panels, the flexible OLED display panels of the present disclosure adds a titanium metal layer in the flexible substrate in order to effectively absorb energy of laser. Such configuration could reduce thickness of the inorganic barrier layer and further increase flexibility of the flexible OLED display panels. The present disclosure solves the problems existing in conventional organic flexible OLED display panels, where the inorganic barrier layer of flexible substrates is thick, which influences the flexibility of flexible OLED display panels, making it difficult for flexible OLED display panels to achieve the desired flexibility.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A flexible organic light-emitting diode (OLED) display panel including a flexible substrate and a plurality of thin film transistor (TFT) devices disposed on the flexible substrate, the flexible substrate comprising:
    a first polyimide (PI) layer;
    a first inorganic barrier layer disposed on a surface of the first PI layer;
    a titanium metal layer disposed on a surface of the first inorganic barrier layer, wherein the titanium metal layer is patterned to form a pattern of the titanium metal layer;
    a second PI layer directly disposed on a surface of the titanium metal layer; and
    a second inorganic barrier layer disposed on a surface of the second PI layer;
    wherein the TFT devices are disposed on a surface of the second inorganic barrier layer;
    wherein the TFT devices include at least an active layer, a projection of the pattern of the titanium metal layer on the second inorganic barrier layer corresponds to a pattern of the active layer, and the pattern of the titanium metal layer is positioned opposite to the active layer.

2. The flexible OLED display panel according to claim 1, wherein the first inorganic barrier layer and the second inorganic barrier layer are made of $TiO_2$.

3. The flexible OLED display panel according to claim 1, wherein a thickness of the first PI layer and a thickness of the second PI layer are same, a thickness of the first inorganic barrier layer and a thickness of the second inorganic barrier layer are same, and the thickness of the first inorganic barrier layer and the thickness of the second inorganic barrier layer are one third of the thickness of the first PI layer and the thickness of the second PI layer.

4. The flexible OLED display panel according to claim 3, wherein a thickness of the titanium metal layer, the thickness of the first inorganic barrier layer, and the thickness of the second inorganic barrier layer are same.

5. A flexible organic light-emitting diode (OLED) display panel including a flexible substrate and a plurality of thin film transistor (TFT) devices disposed on the flexible substrate, the flexible substrate comprising:
    a first polyimide (PI) layer;
    a first inorganic barrier layer disposed on a surface of the first PI layer;
    a titanium metal layer disposed on a surface of the first inorganic barrier layer, wherein the titanium metal layer is patterned;
    a second PI layer directly disposed on a surface of the titanium metal layer; and a second inorganic barrier layer disposed on a surface of the second PI layer;
wherein the TFT devices are disposed on a surface of the second inorganic barrier layer.

6. The flexible OLED display panel according to claim 5, wherein the first inorganic barrier layer and the second inorganic barrier layer are made of $TiO_2$.

7. The flexible OLED display panel according to claim 5, wherein a thickness of the first PI layer and a thickness of the second PI layer are same, a thickness of the first inorganic barrier layer and a thickness of the second inorganic barrier layer are same, and the thickness of the first inorganic barrier layer and the thickness of the second inorganic barrier layer are one third of the thickness of the first PI layer and the thickness of the second PI layer.

8. The flexible OILED display panel according to claim 7, wherein a thickness of the titanium metal layer, the thickness of the first inorganic barrier layer, and the thickness of the second inorganic barrier layer are same.

9. A method for manufacturing a flexible organic light-emitting diode (OLED) display panel, comprising:
   a step S10 of providing a glass base plate;
   a step S20 of forming a first polyimide (PI) layer on the glass base plate;
   a step S30 of forming a first inorganic barrier layer on the surface of the first PI layer;
   a step S40 of forming a titanium metal layer on a surface of the first inorganic barrier layer;
   a step S50 of forming a second PI layer directly on a surface of the titanium metal layer;
   a step S60 of forming a second inorganic barrier layer on a surface on the second PI layer; and
   a step S70 of forming a plurality of thin film transistor (TFT) devices on a surface of the second inorganic barrier layer;
   wherein the step S40 further comprises:
      a step S401 of patterning the titanium metal layer to form a pattern on the titanium metal layer.

10. The method for manufacturing the flexible OLED display panel according to claim 9, wherein the step S70 comprises:
   a step S701 of correspondingly forming the TFT devices directly above and opposite to the pattern of the titanium-metal layer.

11. The method for manufacturing the flexible OLED display panel according to claim 9, wherein the method further comprises:
   a step S80 of using a laser to separate the first PI layer from the glass base plate.

* * * * *